United States Patent
Nakagawa et al.

(10) Patent No.: US 7,737,480 B2
(45) Date of Patent: Jun. 15, 2010

(54) SEMICONDUCTOR MEMORY DEVICE AND MANUFACTURING METHOD THEREOF

(75) Inventors: Ryo Nakagawa, Hyogo (JP); Takashi Nakabayashi, Toyama (JP); Hideyuki Arai, Toyama (JP)

(73) Assignee: Panasonic Corporation, Osaka (JP)

( * ) Notice: Subject to any disclaimer, the term of this patent is extended or adjusted under 35 U.S.C. 154(b) by 157 days.

(21) Appl. No.: 11/826,089

(22) Filed: Jul. 12, 2007

(65) Prior Publication Data

US 2008/0035975 A1     Feb. 14, 2008

(30) Foreign Application Priority Data

Aug. 9, 2006   (JP) .............................. 2006-217222

(51) Int. Cl.
 *H01L 31/062*   (2006.01)
(52) U.S. Cl. ................ 257/296; 257/211; 257/E21.658
(58) Field of Classification Search ................ 257/296, 257/211, E21.658
See application file for complete search history.

(56) References Cited

U.S. PATENT DOCUMENTS 6,097,621 A * 8/2000 Mori ........................... 365/63
6,130,449 A * 10/2000 Matsuoka et al. ........... 257/296
6,403,413 B2 * 6/2002 Hayano et al. .............. 438/238

FOREIGN PATENT DOCUMENTS

JP       10-242422       9/1998

* cited by examiner

*Primary Examiner*—Wael Fahmy
*Assistant Examiner*—John C Ingham
(74) *Attorney, Agent, or Firm*—McDermott Will & Emery LLP

(57) ABSTRACT

A semiconductor memory device includes: a transistor formed in a substrate; a capacitor formed above one of source/drain regions of the transistor; a bit line formed above the substrate and extending in the gate length direction of the transistor; a first conductive plug connecting one of the source/drain regions and the capacitor; a second conductive plug connected to the other source/drain region that is not connected to the first conductive plug; and a third conductive plug formed on the second conductive plug and connected to the bit line. The central axis of the third conductive plug is displaced from the central axis of the second conductive plug in the gate width direction of the transistor.

6 Claims, 5 Drawing Sheets

SEMICONDUCTOR MEMORY DEVICE AND MANUFACTURING METHOD THEREOF

BACKGROUND OF THE INVENTION

1. Field of the Invention

The present invention relates to a semiconductor memory device, such as a DRAM and a manufacturing method thereof.

2. Description of the Prior Art

Some DRAMs (Dynamic Random Access Memories) as volatile semiconductor memories have a CUB (Capacitor Under Bit-line) structure in which a capacitor is formed before a bit line (see Japanese Patent Application Laid Open Publication No. 10-242422, for example). FIG. 5A is a top view showing a conventional DRAM having a CUB structure. FIG. 5B is a sectional view taken along the line Vb-Vb in FIG. 5A, and FIG. 5C is a sectional view taken along the line Vc-Vc in FIG. 5A.

As shown in FIG. 5B and FIG. 5C, the conventional DRAM includes: source/drain regions 114 of a MOS (Metal Oxide Semiconductor) transistor formed in a silicon substrate 111; a gate insulating film 113 formed on the substrate 111 between the source/drain regions 114 when viewed in plan; a gate electrode 123 formed on the gate insulating film 113; a first interlayer insulting film 115 formed on the substrate 111, the source/drain regions 114, and the gate electrode 123; and a liner film 122 formed on the first interlayer insulating film 115. The conventional DRAM further includes: a second interlayer insulating film 117 formed on the liner film 122 and having a trench; a capacitor composed of a storage node electrode 118, a capacitance insulating film 119, and a plate electrode 120 which are formed on one of the source/drain regions 114 along the inner wall of the trench in this order from below; a third interlayer insulating film 128 formed on the plate electrode 120 and the second interlayer insulating film 117; and a bit line 124 formed on the third interlayer insulating film 128 and extending in the gate length direction of the MOS transistor.

Moreover, the conventional DRAM includes: a first conductive plug 116a passing through the first interlayer insulating film 115 and connecting one of the source/drain regions 114 and the storage node electrode 118; a second conductive plug 116b passing through the first interlayer insulating film 115 and connected to the other source/drain region 114 that is not connected to the first conductive plug 116a; and a third conductive plug 121 passing through the liner film 122, the second interlayer insulating film 117, and the third interlayer insulating film 128 on the second conductive plug 116b and connecting the second conductive plug 116b and the bit line 124. The central axis of the third conductive plug 121 agrees with the central axis of the second conductive plug 116b. Wherein, the MOS transistor includes a plurality of MOS transistors separated from each other by an element isolation insulting film 112 formed in the substrate 111. Each MOS transistor and one capacitor connected thereto compose one memory cell.

As shown in FIG. 5A, each third conductive plug 121 is surrounded by a hole 125 of the plate electrode 120 when viewed in plan and is arranged in such a fashion that the central axis thereof is intersected with an extension connecting the major axes at the bottom of the storage node electrodes 118 formed on the respective sides of the third conductive plug 121. Though the capacitance insulating film 119, the plate electrode 120, the third interlayer insulating film 128, and the bit line 124 are not shown in FIG. 5A, the plate electrodes 120 are formed integrally and entirely above the substrate 111 and form the holes 125 surrounding the third conductive plugs 121.

As described above, the conventional DRAM shown in FIG. 5 includes capacitors having a 3-D structure, so that the sufficient capacitance of the capacitors can be secured with the projection area reduced, leading to reduction in cell area.

SUMMARY OF THE INVENTION

In recent years, in order to promote higher integration of semiconductor memories, a further increase in capacitance of the capacitors is demanded. For increasing the capacitance of the capacitors in the conventional DRAM, the area of at least the storage node electrodes 118 composing the capacitors must be increased.

Nevertheless, since the third conductive plug 121 is present between two storage node electrodes 118 in the conventional DRAM, as shown in FIG. 5A, the dimension in the longitudinal direction of each storage node electrode 118 cannot be increased sufficiently, namely it is difficult to increase the area of the storage node electrodes 118.

The present invention has been made for tackling the above disadvantage and has its object of providing a semiconductor memory device including a capacitor capable of storing a sufficient amount of charges and a manufacturing method thereof.

To solve the above problems, the present invention provides a semiconductor memory device including: a MIS transistor including source/drain regions formed in a substrate; a first interlayer insulating film formed on the substrate and the MIS transistor; a capacitor including a storage node electrode formed above one of the source/drain regions, a capacitor insulating film formed on the storage node electrode, and a plate electrode formed on the capacitor insulting film; a second interlayer insulating film formed on or above the plate electrode and the first interlayer insulating film; a bit line formed on the second interlayer insulating film and extending in a gate width direction of the MIS transistor; a first conductive plug passing through the first interlayer insulating film and connecting one of the source/drain regions and the storage node electrode; a second conductive plug passing through the first interlayer insulating film and connected to other source/drain region that is not connected to the first conductive plug; and a third conductive plug passing through at least the second interlayer insulating film on the second conductive plug and connecting the second conductive plug and the bit line, wherein a central axis of the third conductive plug is displaced from a central axis of the second conductive plug in a direction perpendicular to a direction that the bit line extends when viewed in plan.

In the above arrangement, the third conductive plug is arranged on the second conductive plug in such a fashion that the central axis thereof is displaced from the central axis of the second conductive plug in the direction perpendicular to the direction that the bit line extends. This increases the distance between the third conductive plug and the trench where the capacitor is formed to increase each dimension in the longitudinal direction of the storage node electrode, the capacitor insulating film, and the plate electrode, leading to an increases in effective area of the capacitor. As a result, the capacitance of the capacitor increases, thereby attaining a semiconductor memory device capable of storing charges sufficient to be operable as a memory.

In the semiconductor memory device of the present invention, it is preferable to include further a third interlayer insulating film formed between the first interlayer insulating film and the second interlayer insulating film and having a trench reaching the first conductive plug, wherein the storage node electrode, the capacitor insulating film, and the plate electrode are formed along an inner wall of the trench.

With the capacitor having a 3-D structure, the cell area can be minimized when compared with a semiconductor memory device including a capacitor having a 2-D structure. Hence, in addition to the above effects attained, the semiconductor memory device of the above aspect can perform memory operation definitely even when miniaturized.

In the semiconductor memory device of the present invention, it is preferable that a lower end part of the third conductive plug is embedded in the first interlayer insulating film and the third conductive plug is in contact at the lower end part thereof with part of an upper end part at an upper face and a side face of the second conductive plug.

In the above arrangement, the lower end part of the third conductive plug is connected to the part of the upper end at not only the upper face but also the side face of the second conductive plug to increase the contact area between the second conductive plug and the third conductive plug, resulting in reduction in contact resistance.

A semiconductor memory manufacturing method in accordance with the present invention is a method for manufacturing a semiconductor memory device including: a MIS transistor including source/drain regions; a capacitor including a storage node electrode, a capacitor insulating film, and a plate electrode; a first conductive plug; a second conductive plug; a third conductive plug; and a bit line, which includes the steps of: (a) forming the source/drain regions in a substrate; (b) forming a first interlayer insulating film on the substrate; (c) forming, on the source/drain regions, the first conductive plug and the second conductive plug so as to pass through the first interlayer insulating film; (d) forming, above the first interlayer insulating film, a second interlayer insulating film in which a trench for exposing the first conductive plug is formed; (e) forming sequentially the storage node electrode, the capacitor insulating film, and the plate electrode along an inner wall of the trench; (f) forming a third interlayer insulating film on the plate electrode and the second interlayer insulating film; (g) forming a contact hole having a central axis displaced from a central axis of the second conductive plug in a gate width direction of the MIS transistor so as to pass through the second interlayer insulating film and the third interlayer insulating film and so as to expose part of the second conductive plug; (h) forming the third conductive plug so as to be connected to the second conductive plug by filling a conductive material to the contact hole; and (i) forming the bit line on the third inter layer insulating film so as to be connected to one of the source/drain regions through the second conducive plug and the third conductive plug.

In the above method, the contact hole is formed in the contact hole forming step (g) so that the central axis thereof is displaced from the central axis of the second conductive plug in the gate width direction of the MOS transistor (the direction perpendicular to the direction that the bit line extends). This leads to formation of the third conductive plug on the second conductive plug with its central axis displaced in the gate width direction, increasing the distances between the third conductive plug and the trench on each side of the third conductive plug where the capacitor is formed. Accordingly, each dimension in the longitudinal direction of the storage node electrode, the capacitor insulating film, and the plate electrode can be increased in the former capacitor forming step (e) to increase the effective area of the capacitor. Hence, the capacitance of the capacitor increases, which means that a semiconductor memory device capable of storing charges sufficient to be operable as memory can be manufactured.

DESCRIPTION OF THE PREFERRED EMBODIMENTS

Embodiment 1

Figure 1A:
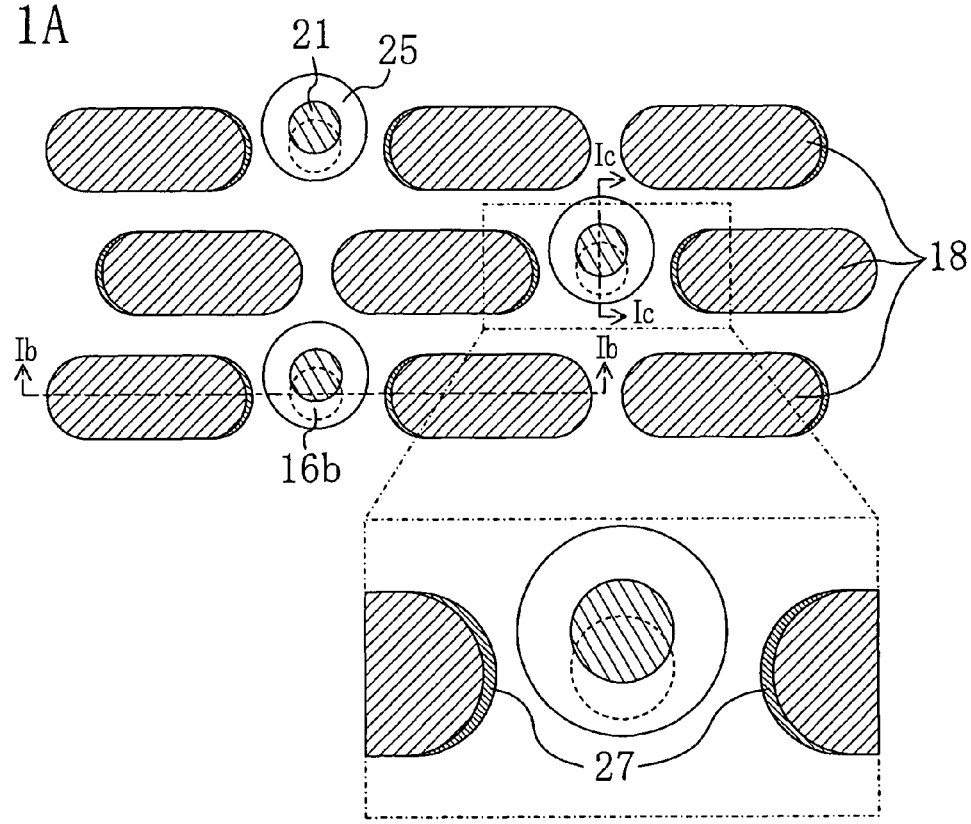
FIG. 1A is a top view showing a structure of a semiconductor memory device in accordance with Embodiment 1 of the present invention.

A semiconductor memory device and a manufacturing method thereof in accordance with Embodiment 1 of the present invention will be described below with reference to FIG. 1 and FIG. 2. Description will be given first to a semiconductor memory device of a DRAM in accordance with Embodiment 1. FIG. 1A is a top view showing a structure of the semiconductor memory device in accordance with the present embodiment of the present invention, FIG. 1B is a sectional view taken along the line Ib-Ib in FIG. 1A, and FIG. 1C is a sectional view taken along the line Ic-Ic in FIG. 1A.

Figure 1B:
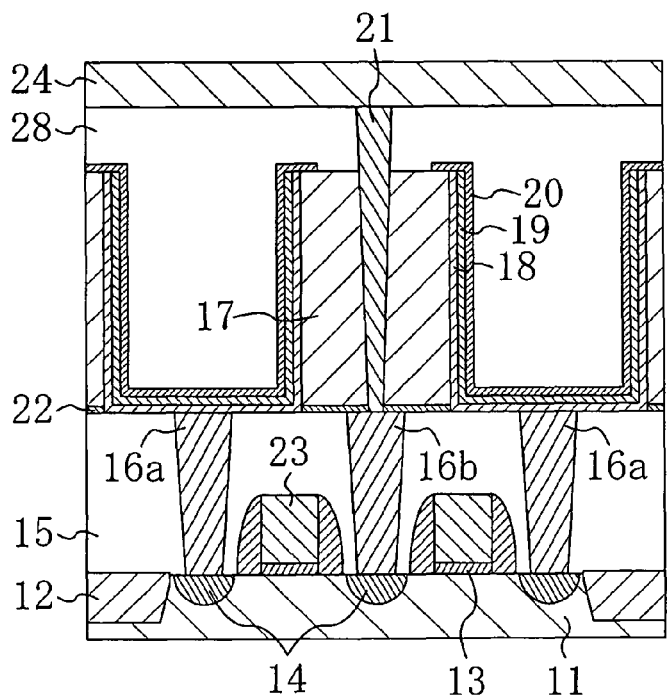
FIG. 1B is a sectional view taken along the line Ib-Ib in FIG. 1A.
Figure 1C:
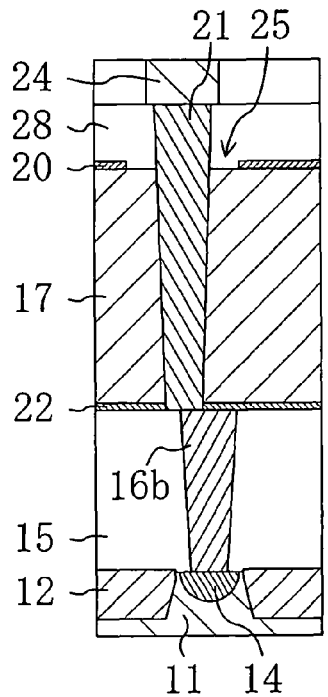
FIG. 1C is a sectional view taken along the line Ic-Ic in FIG. 1A.

As shown in FIG. 1B and FIG. 1C, the semiconductor memory device of the present embodiment includes: source/drain regions 14 of a MOS (MIS: Metal-Insulator-Semiconductor) transistor formed in a substrate 11 made of, for example, silicon; a gate insulating film 13 formed on the substrate 11 between the source/drain regions 14 when viewed in plan; a gate electrode 23 formed on the gate insulating film 13; a first interlayer insulating film 15 formed on the substrate 11, the source/drain regions 14, and the gate electrode 23; and a liner film 22 formed on the first interlayer insulating film 15. The semiconductor memory device of the present embodiment further includes: a second interlayer insulating film 17 formed on the liner film 22 and having a trench; a capacitor composed of a storage node electrode 18, a capacitor insulating film 19, and a plate electrode 20, which are formed above one of the source/drain regions 14 along the inner wall of the trench in this order from below; a third interlayer insulating film 28 formed on the plate electrode 20 and the second interlayer insulating film 17; and a bit line 24 formed on the third interlayer insulating film 28 and extending in the gate length direction of the MOS (MIS) transistor. The first interlayer insulating film 15, the second interlayer insulating film 17, and the third interlayer insulating film 28 are formed of silicon oxide films, and the liner film 22 is formed of a silicon nitride film, for example.

The semiconductor memory device of the present embodiment additionally includes a first conductive plug 16a, a second conductive plug 16b, and a third conductive plug 21.

The first conductive plug 16a passes through the first interlayer insulating film 15 to connect one of the source/drain regions 14 and the storage node electrode 18. The second conductive plug 16b passes through the first interlayer insulating film 15 to be connected to the other source/drain region 14 that is not connected to the first conductive plug 16a. The third conductive plug 21 is formed on the second conductive plug 16b and passes through the liner film 22, the second interlayer insulating film 17, and the third interlayer insulating film 28 to connect the second conductive plug 16b and the bit line 24. Wherein, the semiconductor memory device of the present embodiment includes a plurality of MOS (MIS) transistors, which are separated by an element isolation insulating film 12 formed in the substrate 11. Each MOS (MIS) transistor and one capacitor connected thereto compose one memory cell.

As shown in FIG. 1A, when viewed in plan, the third conductive plug 21 is surrounded by a hole 25 of the plate electrode 20 and arranged in such a fashion that the central axis thereof is displaced from the central axis of the second conductive plug 16b in the direction perpendicular to the direction that the bit line 24 extends (the gate width direction of the MOS transistor). While, the central axis of the second conductive plug 16b is intersected with an extension connecting the major axes at the bottom of storage node electrodes 18 formed on the respective sides of the third conductive plug 21. Though the capacitor insulating film 19, the plate electrode 20, the third interlayer insulating film 28, and the bit line 24 are not shown in FIG. 1A, the plate electrodes 20 of the semiconductor memory device are formed integrally and entirely above the substrate 11 and have the holes 25 surrounding the third conductive plugs 21 in actual fact.

The significant feature of the semiconductor memory device of the present embodiment lies in that the third conductive plug 21 is formed on the second conductive plug 16b in such a fashion that the central axis thereof is displaced from the central axis of the second conductive plug 16b in the direction perpendicular to the direction that the bit line 24 extends. This increases the distance between the hole 25 surrounding the third conductive plug 21 and the trench where the capacitor is formed to increase each dimension in the longitudinal direction of the storage node electrode 18, the capacitor insulating film 19, and the plate electrode 20 in the trench, as indicated by the area increased part 27 shown in FIG. 1A, thereby increasing the effective area of the capacitor. As a result, the capacitance of the capacitor increases, attaining a semiconductor memory device capable of storing charges sufficient to be operable as a memory.

Further, each capacitor of the semiconductor memory device of the present embodiment has a 3-D structure, thereby minimizing the cell area when compared with a semiconductor memory device including capacitors having a 2-D structure. Hence, the semiconductor memory device of the present embodiment increases in capacitance and can perform memory operation definitely even when miniaturized.

A semiconductor memory device manufacturing method in accordance with Embodiment 1 of the present invention will be described next with reference to FIG. 2. FIG. 2A to FIG. 2F are sectional views showing the semiconductor memory device manufacturing method in accordance with the present embodiment. FIG. 2A to FIG. 2F correspond to FIG. 1C and do not show part of the semiconductor memory device, such as the transistor, the capacitor, and the like.

Figure 2A:
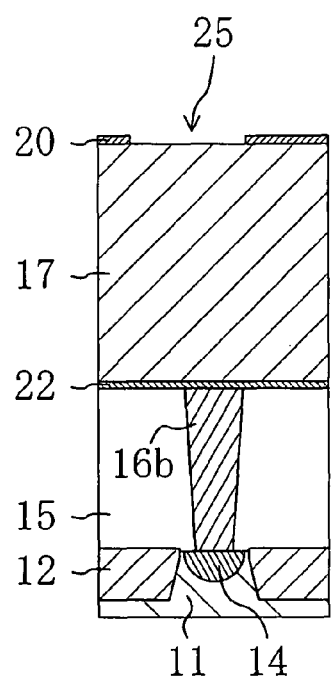
FIG. 2A to FIG. 2F are sectional views showing a semiconductor memory device manufacturing method in accordance with Embodiment 1.

First, as shown in FIG. 2A, the element isolation insulating film 12 is formed in the substrate 11 for separating an active region of the MOS (MIS) transistor in each memory cell. Then, a silicon oxide film having a thickness of, for example, several nanometers and a polysilicon film having a thickness of approximately 100 nm are deposited on the substrate 11 sequentially. The thus deposited films are patterned to form a gate insulating film (not shown) and a gate electrode (not shown) of the MOS (MIS) transistor, which are formed of the silicon oxide film and the polysilicon film, respectively. Then, an arsenic ion is implanted to the active region formed in the substrate 11 to form the source/drain regions 14 of the MOS (MIS) transistor. The first insulating film 15 formed of a silicon oxide film or the like is deposited on the substrate 11, and the thus formed first insulating film 15 is planarized by CMP (Chemical Mechanical Polish). Then, contact holes are formed so as to pass through the first interlayer insulating film 15 and reach the source/drain regions 14, and a conductive material is filled in the contact holes to form the first conductive plug 16a (not shown) and the second conductive plug 16b.

Next, the liner film 22 formed of a silicon nitride film or the like is formed on the first interlayer insulating film 15, the first conductive plug 16a, and the second conductive plug 16b. The second interlayer insulating film 17 formed of a silicon oxide film or the like is deposited on the liner film 22, and the thus formed second interlayer insulating film 17 is planarized by CMP. The second interlayer insulating film 17 is then etched with the use of a patterned mask to form in the second interlayer insulating film 17 the trench that exposes the first conductive plug 16a. Then, though not shown, the storage node electrode 18, the capacitor insulating film 19, and the plate electrode 20 are sequentially formed along the inner wall of the trench formed in the second interlayer insulating film 17 to form the capacitor. Referring to the level of the semiconductor memory device, the plate electrodes 20 are formed integrally and entirely above the substrate 11. Then, the integrally and entirely formed plate electrode 20 is etched to form the hole 25 from which the second interlayer insulating film 17 is exposed. The hole 25 is formed so that the central axis thereof is displaced from the central axis of the second conductive plug 16b in the gate width direction of the MOS (MIS) transistor.

Figure 2B:
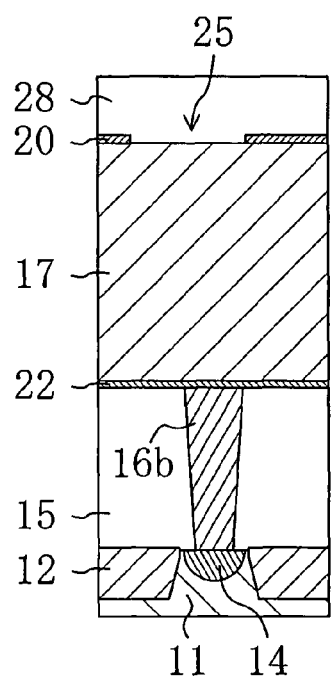

Subsequently, in the step shown in FIG. 2B, the third interlayer insulating film 28 formed of a silicon oxide film or the like is deposited on the plate electrode 20 and the second interlayer insulating film 17, and the thus formed third interlayer insulating film 28 is planarized by CMP.

Figure 2C:
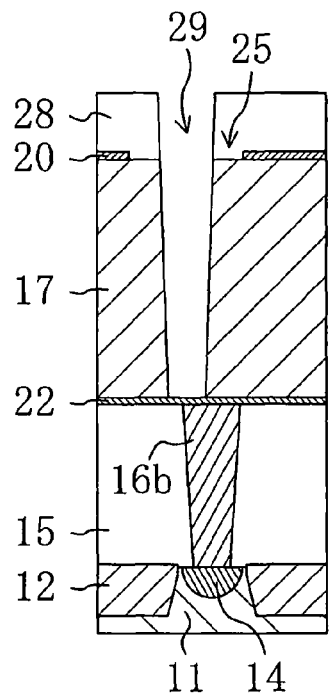

Thereafter, in the step shown in FIG. 2C, patterning is performed with the use of a resist (not shown) formed on the third interlayer insulating film 28, and etching is performed on the third interlayer insulating film 28 and the second interlayer insulating film 17 until the liner film 22 is exposed to form a contact hole 29. The contact hole 29 is formed so that the central axis thereof is displaced from the central axis of the second conductive plug 16b in the gate width direction of the MOS (MIS) transistor.

Figure 2D:
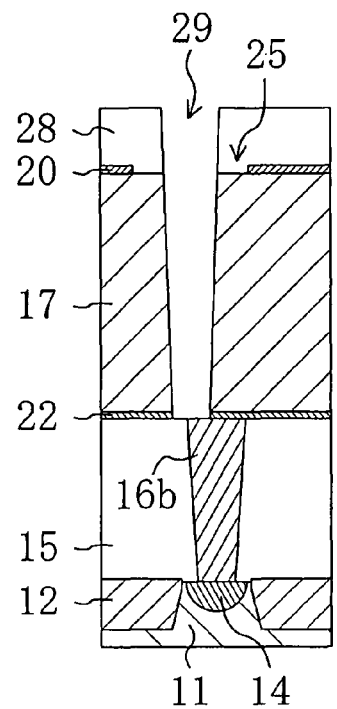

Next, in the step shown in FIG. 2D, the resist (not shown) on the third interlayer insulating film 28 is removed by ashing, and etching is further performed on the liner film 22 at the bottom of the contact hole 29 to expose the second conductive plug 16b.

Figure 2E:
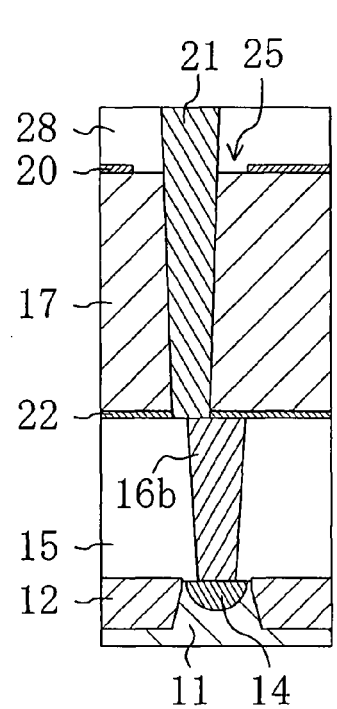

Subsequently, in the step shown in FIG. 2E, a conductive material is filled in the contact hole 29 to form the third conductive plug 21.

Figure 2F:
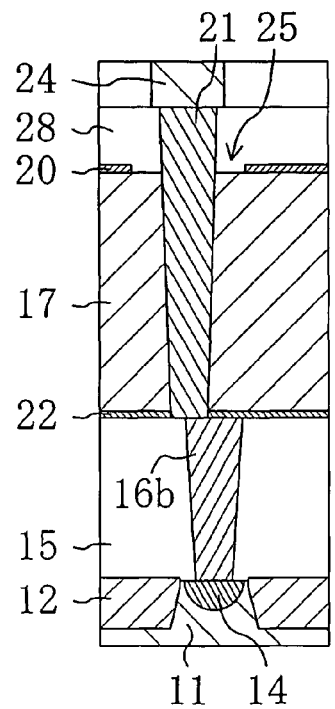

Finally, in the step shown in FIG. 2F, the bit line 24 is formed on the third interlayer insulating film 28 and the third conductive plug 21 so as to be connected through the second conductive plug 16b and the third conductive plug 21 to one of the source/drain region 14 of the MOS (MIS) transistor which is connected to the second conductive plug 16b.

Through the above described steps, the semiconductor memory device of the present embodiment is manufactured.

The significant feature of the semiconductor memory device manufacturing method of the present embodiment lies in that in the contact hole forming step shown in FIG. 2C, the contact hole 29 is formed so that the central axis thereof is displaced from the central axis of the second conductive plug 16b in the gate width direction of the MOS (MIS) transistor (the direction perpendicular to the direction that the bit line 24 extends). This leads to formation of the third conductive plug 21 on the second conductive plug 16b with its central axis displaced in the gate width direction to increase the distance between the third conductive plug 21 and the trench on each side of the third conductive plug 21 where the capacitor is formed. Accordingly, each dimension in the longitudinal direction of the storage node electrode 18, the capacitor insulating film 19, and the plate electrode 20 in the trench increases as indicated by an area increased part 27 shown in FIG. 1A. As a result, the capacitance of the capacitor increases, and thus, a semiconductor memory device capable of storing charges sufficient to be operable as a memory can be manufactured.

In the manufacturing method in the present embodiment, when the diameter of the hole 25 of the plate electrode 20 is set to 200 nm, the distance between two storage node electrodes formed on the respective sides of the third conductive plug 21 is set to 260 nm, and the central axis of the third conductive plug 21 is displaced 45 nm from the central axis of the second conductive plug 16b in the gate width direction, for example, the surface area of the storage node electrode 18 increases approximately 2.5% when compared with one including a third conductive plug arranged coaxially with the second conductive plug.

Further, in the semiconductor memory device manufacturing method of the present embodiment, it is preferable to form the hole 25 of the plate electrode 20 in the step shown in FIG. 2A so that the central axis of the hole 25 is displaced from the central axis of the second conductive plug 16b in the gate width direction of the MOS (MIS) transistor. When doing so, the contact hole 29 can be formed coaxially with the hole 25, which means facilitation of positioning of the contact hole 29, leading to comparatively easy formation of the third conductive plug 21.

It is noted that though the present embodiment refers to a semiconductor memory device including capacitors having a 3-D structure and a manufacturing method thereof, the present invention is not limited thereto. The same effects can be obtained when the present embodiment is applied to a semiconductor memory device including capacitors having a 2-D structure.

Embodiment 2

A semiconductor memory device and a manufacturing method thereof in accordance with Embodiment 2 of the present invention will be described below with reference to FIG. 3 and FIG. 4. Description will be given first to a semiconductor memory device of a DRAM in accordance with the present embodiment. FIG. 3A and FIG. 3B are sectional views showing a structure of the semiconductor memory device in accordance with Embodiment 2 of the present invention, wherein FIG. 3A corresponds to FIG. 1B, and FIG. 3B corresponds to FIG. 1C.

Figure 3A:
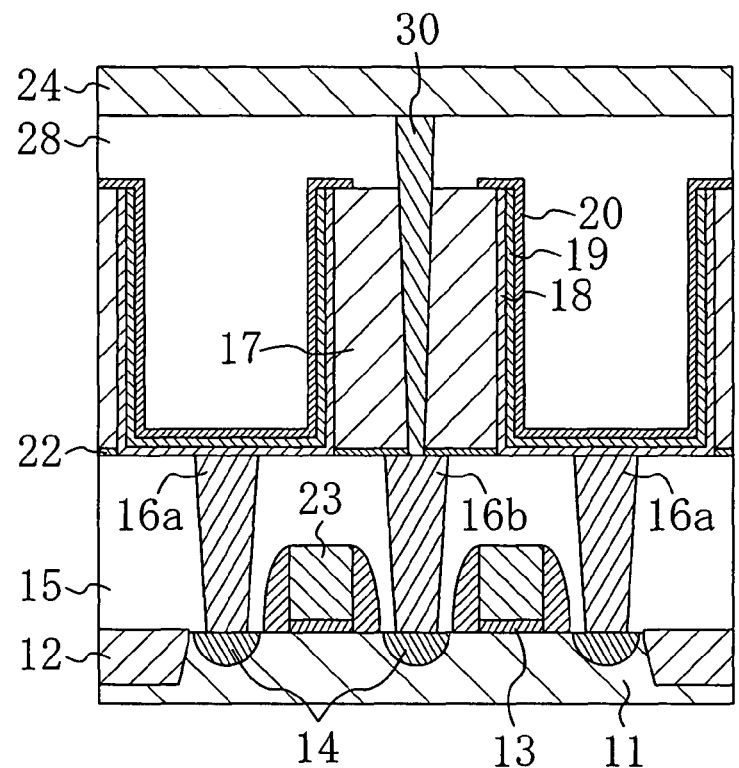
FIG. 3A and FIG. 3B are sectional views showing a structure of a semiconductor memory device in accordance with Embodiment 2 of the present invention.
Figure 3B:
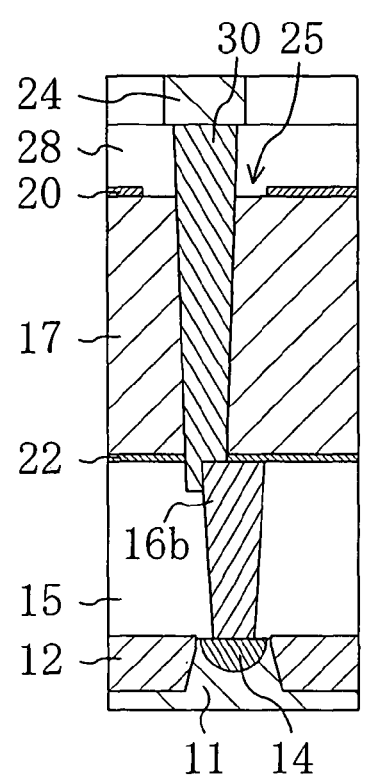

As shown in FIG. 3A and FIG. 3B, the semiconductor memory device of the present embodiment includes, similarly to that of Embodiment 1: source/drain regions 14 of a MOS (MIS) transistor formed in a substrate 11 made of, for example, silicon; a gate insulating film 13 and a gate electrode 23 formed in this order from below on the substrate 11 between the source/drain regions 14 when viewed in plan; a first interlayer insulating film 15 formed on the substrate 11, the source/drain regions 14, and the gate electrode 23; and a liner film 22 formed on the first interlayer insulating film 15. The semiconductor memory device of the present embodiment further includes: a second interlayer insulating film 17 formed on the liner film 22 and having a trench; a capacitor composed of a storage node electrode 18, a capacitor insulating film 19, and the plate electrode 20, which are formed above one of the source/drain regions 14 along the inner wall of the trench in this order from below; a third interlayer insulating film 28 formed on the plate electrode 20 and the second interlayer insulating film 17; and a bit line 24 formed on the third interlayer insulating film 28 and extending in the gate length direction of the MOS (MIS) transistor. The first interlayer insulating film 15, the second interlayer insulating film 17, and the third interlayer insulating film 28 are formed of silicon oxide films, and the liner film 22 is formed of a silicon nitride film, for example.

The semiconductor memory device of the present embodiment additionally includes, similarly to that of Embodiment 1, a first conductive plug 16a, a second conductive plug 16b, and a fourth conductive plug 30. The first conductive plug 16a connects one of the source/drain regions 14 and the storage node electrode 18. The second conductive plug 16b is connected to the other source/drain region 14 that is not connected to the first conductive plug 16a. The fourth conductive plug 30 connects the second conductive plug 16b and the bit line 24. Wherein, the semiconductor memory device of the present embodiment includes a plurality of MOS (MIS) transistors, which are separated by an element isolation insulating film 12 formed in the substrate 11. Each MOS (MIS) transistor and one capacitor connected thereto compose one memory cell.

In the semiconductor memory device of the present embodiment, as shown in FIG. 3B, the lower end part of the fourth conductive plug 30 is embedded in the first interlayer insulating film 15 so as to be in contact with part of the upper end part at the top face and the side face of the second conductive plug 16b. Further, similarly to the third conductive plug 21 in Embodiment 1, the fourth conductive plug 30 is surrounded by the hole 25 of the plate electrode 20, and the central axis of the fourth conductive plug 30 is displaced from the central axis of the second conductive plug 16b in the gate width direction of the MOS (MIS) transistor (the direction perpendicular to the direction that the bit line 24 extends). Referring to the structure in the level of the semiconductor memory device, the central axis of the second conductive plug 16b is intersected with an extension connecting the major axes at the bottom of the storage node electrodes 18 formed on the respective sides of the third conductive plug 21, and the plate electrodes 20 are formed integrally and entirely above the substrate 11 and have the holes 25 surrounding the fourth conductive plugs 30.

The significant feature the semiconductor memory device of the present embodiment leis in that the central axis of the fourth conductive plug 30 is displaced from the central axis of the second conductive plug 16b in the gate width direction of the MOS (MIS) transistor. This increases the distance between the hole 25 surrounding the fourth conductive plug 30 and the storage node electrode 18, thereby increasing the dimension in the longitudinal direction of the storage node electrode 18 to increase the area of the storage node electrode 18. As a result, the capacitance of the capacitor increases, attaining a semiconductor memory device having a large capacity.

Moreover, in the semiconductor memory device of the present embodiment, the fourth conductive plug 30 is connected at the lower end part thereof to the part of the upper end part at not only the upper face but also the side face of the second conductive plug 16b. This increases the contact area between the second conductive plug 16b and the fourth conductive plug 30, reducing the contact resistance. Hence, the semiconductor memory device of the present embodiment can perform memory operation even when miniaturized, and the contact resistance is reduced.

Figure 4A:
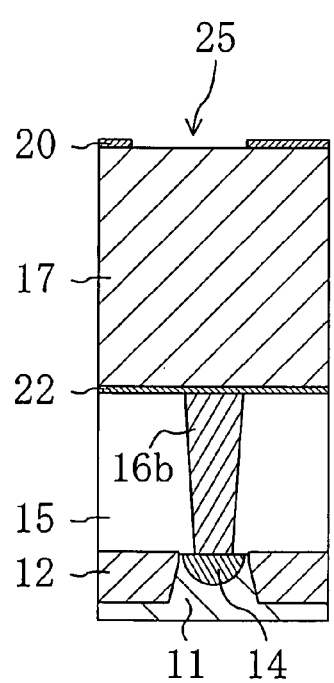
FIG. 4A to FIG. 4F are sectional views showing a semiconductor memory device manufacturing method in accordance with Embodiment 2.
Figure 4B:
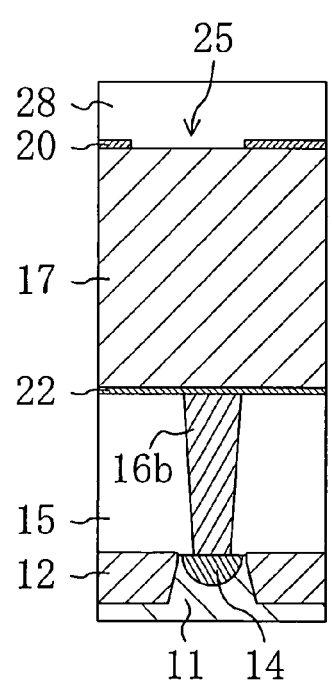
Figure 4C:
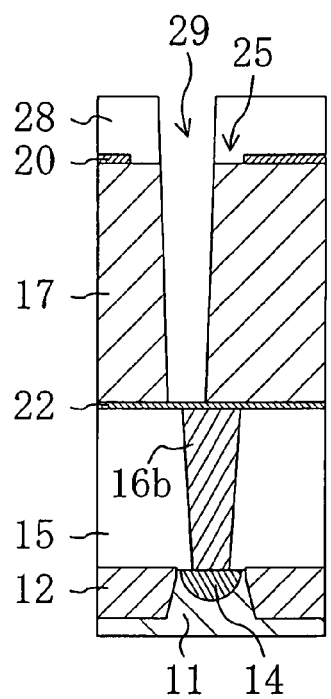

A semiconductor memory device manufacturing method in accordance with Embodiment 2 of the present invention will be described next with reference to FIG. 4. FIG. 4A to FIG. 4F are sectional views showing the semiconductor memory device manufacturing method in accordance with the present embodiment. FIG. 4A to FIG. 4F correspond to FIG. 3C and do not show part of the semiconductor memory device, such as the transistor, the capacitor, and the like. The steps shown in FIG. 4A to FIG. 4C are the same as those shown in FIG. 2A to FIG. 2C in the semiconductor memory device manufacturing method of Embodiment 1 and, therefore, will be described briefly herein.

First, in the step shown in FIG. 4A, the first interlayer insulating film 15 is formed on the substrate 11 in which the element isolation insulating film 2 and the source/drain regions 14 of the MOS (MIS) transistor are formed. Then, contact holes are formed so as to pass through the first interlayer insulating film 15 and reach the source/drain regions 14, and a conductive material is filled in the thus formed contact holes to form the first conductive plug 16a (not shown) and the second conductive plug 16b.

Next, the liner film 22 and the second interlayer insulating film 17 are formed sequentially on the first insulating film 15, the first conductive plug 16a, and the second conductive plug 16b. Then, though not shown, the storage node electrode 18, the capacitor insulating film 19, and the plate electrode 20 are sequentially formed along the inner wall of the trench formed in the second interlayer insulating film 17 to form the capacitor. Referring to the structure in the level of the semiconductor memory device, the plate electrodes 20 are formed integrally and entirely above the substrate 11. The integrally and entirely formed plate electrode 20 is etched to form the hole 25 for exposing the second interlayer insulating film 17. The hole 25 is formed so that the central axis thereof is displaced from the central axis of the second conductive plug 16b in the gate width direction of the MOS (MIS) transistor.

Subsequently, in the step shown in FIG. 4B, the third interlayer insulating film 28 formed of a silicon oxide film or the like is formed on the plate electrode 20 and the second interlayer insulating film 17.

Thereafter, in the step shown in FIG. 4C, a contact hole 29 is formed so as to pass through the third interlayer insulating film 28 and the second interlayer insulating film 17. The contact hole 29 is formed so that the central axis thereof is displaced from the central axis of the second conductive plug 16b in the gate width direction of the MOS (MIS) transistor.

Figure 4D:
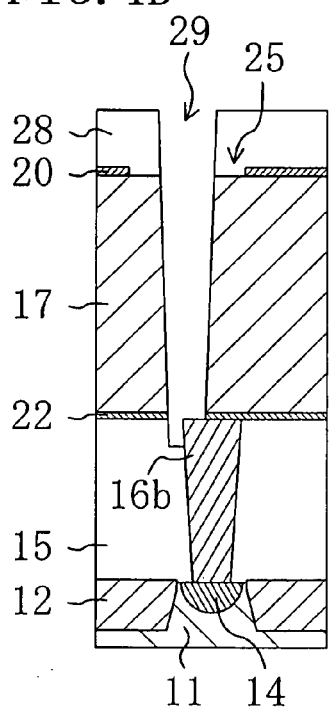

Next, in the step shown in FIG. 4D, the liner film 22 at the bottom of the contact hole 29 is etched, and the interlayer insulating film 15 is over-etched by approximately 20 to 30 nm to expose part of the upper end at the upper face and the side face of the second conductive plug 16b.

Figure 4E:
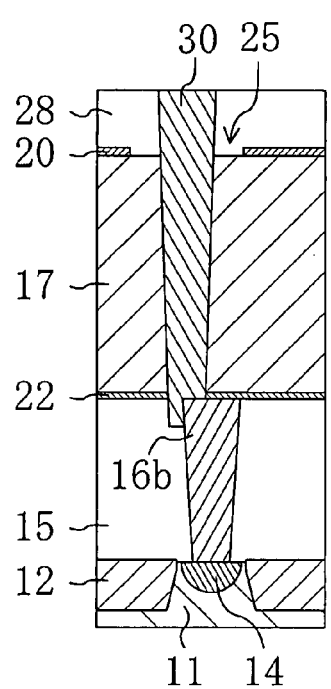

Subsequently, in the step shown in FIG. 4E, a conductive material is filled in the thus formed contact hole 29 to form the fourth conductive plug 30.

Figure 4F:
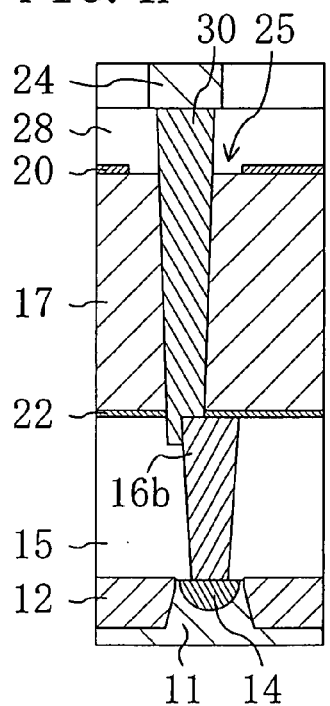
Figure 5A:
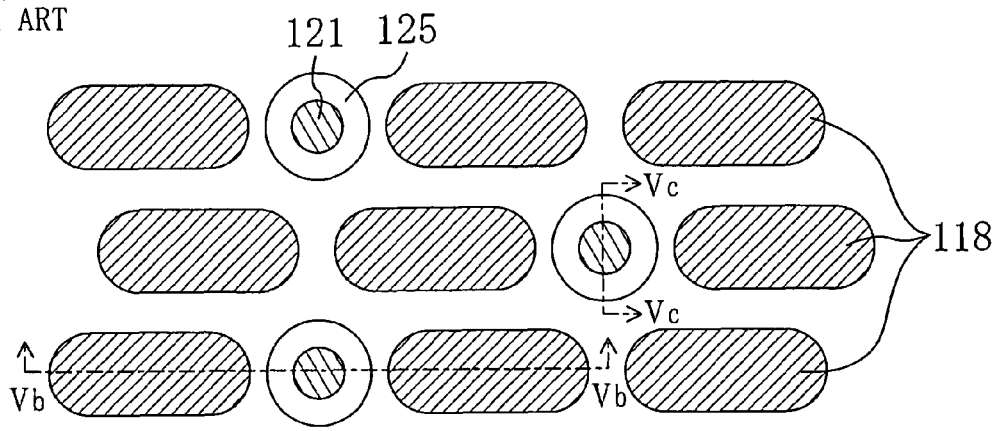
FIG. 5A is a top view showing a structure of a conventional DRAM.
Figure 5B:
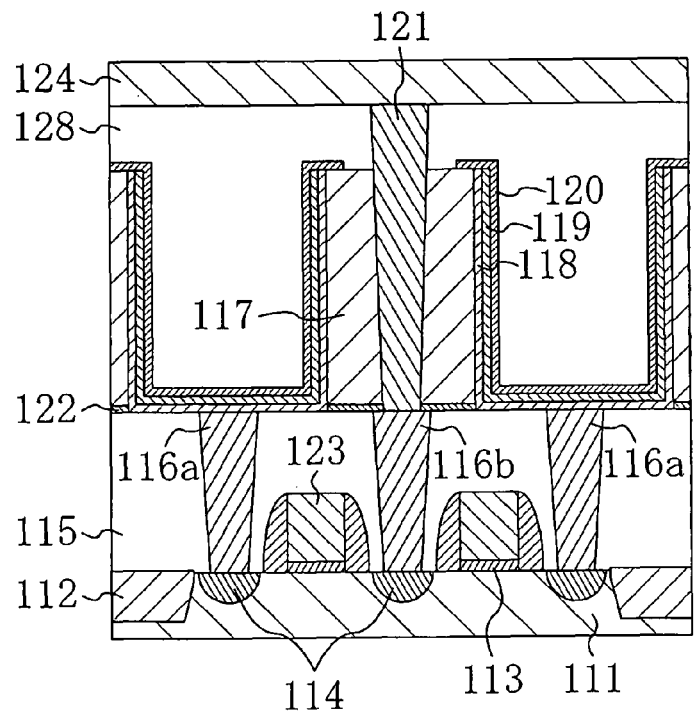
FIG. 5B is a sectional view taken along the line Vb-Vb in FIG. 5A.
Figure 5C:
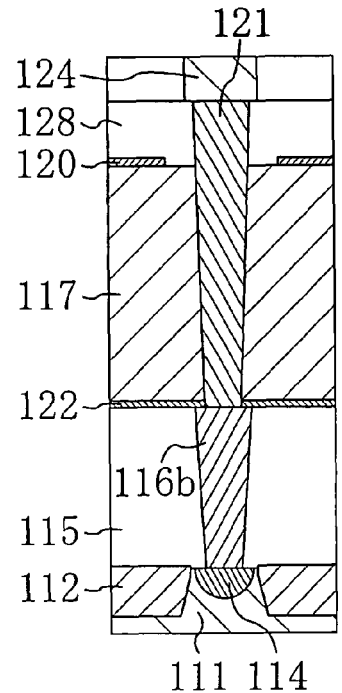
FIG. 5C is a sectional view taken along the line Vc-Vc in FIG. 5A.

Finally, in the step shown in FIG. 4F, the bit line 24 is formed on the third interlayer insulating film 28 and the fourth conductive plug 30 so as to be connected through the second conductive plug 16b and the fourth conductive plug 30 to one of the source/drain regions 14 of the MOS (MIS) transistor which is connected to the second conductive plug 16b. Through the above described steps, the semiconductor memory device of the present embodiment is manufactured.

The significant feature of the semiconductor memory device manufacturing method of the present embodiment lies in that the contact hole 29 is formed in the contact hole forming step shown in FIG. 4D so that the central axis thereof is displaced from the central axis of the second conductive plug 16b in the gate width direction of the MOS (MIS) transistor (the direction perpendicular to the direction that the bit line 24 extends). This leads to formation of the fourth conductive plug 30 on the second conductive plug 16b with its central axis displaced in the gate width direction, similarly to that of Embodiment 1, increasing the distance between the fourth conductive plug 30 and the trench on each side of the fourth conductive plug 30 where the capacitor is formed. Accordingly, the storage node electrode 18, the capacitor insulating film 19, and the plate electrode 20 increase in dimension in the longitudinal direction in the trench.

Furthermore, in the manufacturing method of the present embodiment, the fourth conductive plug 30 is formed so as to be connected at the lower end thereof to the part of the upper end at not only the upper face but also the side face of the second conductive plug 16b. As a result, the contact area between the second conductive plug 16b and the fourth conductive plug 30 increases to reduce the contact resistance. Hence, the semiconductor memory device manufacturing method of the present embodiment achieves manufacture of a semiconductor memory device capable of storing charges sufficient for memory operation and having comparatively small contact resistance. Further, the semiconductor memory device manufacturing method of the present embodiment achieves manufacture of the semiconductor memory device including the capacitors having a 3-D structure and, therefore, is useful in miniaturization of a semiconductor memory device.

It is noted that though the semiconductor memory device and the manufacturing method thereof in the present embodiment refers to a semiconductor memory device including capacitors having a 3-D structure, similarly to Embodiment 1, the present invention is not limited thereto. The same effects can be obtained even when the present embodiment is applied to a semiconductor memory device including capacitors having a 2-D structure.

What is claimed is:

1. A semiconductor memory device comprising:
   a MIS transistor including source/drain regions formed in a substrate;
   a first interlayer insulating film formed on the substrate and the MIS transistor;
   a capacitor including a storage node electrode formed above one of the source/drain regions, a capacitor insulating film formed on the storage node electrode, and a plate electrode formed on the capacitor insulting film;
   a second interlayer insulating film formed on or above the plate electrode and the first interlayer insulating film;
   a bit line formed on the second interlayer insulating film and extending in a gate width direction of the MIS transistor;
   a first conductive plug passing through the first interlayer insulating film and connecting one of the source/drain regions and the storage node electrode;

a second conductive plug passing through the first interlayer insulating film and connected to other source/drain region that is not connected to the first conductive plug; and a third conductive plug passing through at least the second interlayer insulating film on the second conductive plug and connecting the second conductive plug and the bit line, wherein a central axis of the third conductive plug is displaced from a central axis of the second conductive plug in a direction perpendicular to a direction that the bit line extends when viewed in plan, the third conductor plug has a bottom surface, a part of which is in contact with the first interlayer insulating film, a lower end part of the third conductive plug is embedded in the first interlayer insulating film, and the third conductive plug is in contact at the lower end part thereof with part of an upper end part at an upper face and a side face of the second conductive plug.

2. The semiconductor memory device of claim 1, further comprising:

a third interlayer insulating film formed between the first interlayer insulating film and the second interlayer insulating film and having a trench reaching the first conductive plug, wherein the storage node electrode, the capacitor insulating film, and the plate electrode are formed along an inner wall of the trench.

3. The semiconductor memory device of claim 2, wherein the MIS transistor includes a plurality of MIS transistors, the capacitor includes a plurality of capacitors, plate electrodes of the plurality of capacitors are formed integrally, and an opening surrounding the third conductive plug is formed in each integrally formed plate electrode when viewed in plan.

4. The semiconductor memory device of claim 3, wherein a central axis of the opening of each integrally formed plate electrode is displaced from the central axis of the second conductive plug in the direction perpendicular to the direction that the bit line extends.

5. A semiconductor memory device comprising:

a plurality of MIS transistors including source/drain regions formed in a substrate;

a first interlayer insulating film formed on the substrate and the MIS transistor;

a plurality of capacitors including storage node electrodes formed above the source/drain regions, capacitors insulating films formed on the storage node electrodes, and plate electrodes formed on the capacitor insulting films;

a second interlayer insulating film formed on or above the plate electrode and the first interlayer insulating film;

a bit line formed on the second interlayer insulating film and extending in a gate width direction of the MIS transistor;

a first conductive plug passing through the first interlayer insulating film and connecting one of the source/drain regions and the storage node electrode;

a second conductive plug passing through the first interlayer insulating film and connected to other source/drain region that is not connected to the first conductive plug; and a third conductive plug passing through at least the second interlayer insulating film on the second conductive plug and connecting the second conductive plug and the bit line, wherein a central axis of the third conductive plug is displaced from a central axis of the second conductive plug in a direction perpendicular to a direction that the bit line extends when viewed in plan, the plate electrodes of the plurality of capacitors are formed integrally, an opening surrounding the third conductive plug is formed in each integrally formed plate electrode when viewed from above, and a central axis of the opening of each integrally formed plate electrode is displaced from the central axis of the second conductive plug in the direction perpendicular to the direction that the bit line extends.

6. The semiconductor memory device of claim 5, further comprising:

a third interlayer insulating film formed between the first interlayer insulating film and the second interlayer insulating film and having a trench reaching the first conductive plug, wherein the storage node electrode, the capacitor insulating film, and the plate electrode are formed along an inner wall of the trench.

* * * * *